(12) United States Patent
Smith et al.

(10) Patent No.: US 11,368,170 B1
(45) Date of Patent: Jun. 21, 2022

(54) SYSTEMS AND METHODS FOR NYQUIST ERROR CORRECTION

(71) Applicant: Marvell Asia Pte, Ltd., Singapore (SG)

(72) Inventors: Benjamin P. Smith, Ottawa (CA); Jamal Riani, Fremont, CA (US)

(73) Assignee: Marvell Asia Pte, Ltd., Singapore (SG)

( * ) Notice: Subject to any disclaimer, the term of this patent is extended or adjusted under 35 U.S.C. 154(b) by 0 days.

(21) Appl. No.: 17/244,259

(22) Filed: Apr. 29, 2021

(51) Int. Cl.
  *H03M 13/45* (2006.01)
  *H03M 13/11* (2006.01)
  *H03M 13/37* (2006.01)
  *H03M 13/25* (2006.01)
  *H03M 13/00* (2006.01)

(52) U.S. Cl.
  CPC ..... *H03M 13/458* (2013.01); *H03M 13/1105* (2013.01); *H03M 13/256* (2013.01); *H03M 13/3715* (2013.01); *H03M 13/6331* (2013.01)

(58) Field of Classification Search
  CPC .................................................. H03M 13/458
  See application file for complete search history.

(56) References Cited

U.S. PATENT DOCUMENTS

| | | | | |
|---|---|---|---|---|
| 8,407,569 B1* | 3/2013 | Yadav | ................... | H03M 13/13 714/785 |
| 8,621,318 B1* | 12/2013 | Micheloni | ........... | G06F 11/1012 714/755 |
| 2003/0126546 A1* | 7/2003 | Fujita | .................... | H03M 13/45 714/786 |
| 2003/0188248 A1* | 10/2003 | Kauschke | ............. | H03M 13/15 714/755 |
| 2007/0044006 A1* | 2/2007 | Yang | .................. | G11B 20/1833 714/785 |

* cited by examiner

*Primary Examiner* — Joseph D Torres

(57) ABSTRACT

The present invention is directed to communication systems and methods. In a specific embodiment, the present invention provides a receiver that includes an error correction module. A syndrome value, calculated based on received signals, may be used to enable the error correction module. The error correction module includes an error generator, a Nyquist error estimator, and a decoder. The decoder uses error estimation generated by the Nyquist error estimator to correct the decoded data. There are other embodiments as well.

14 Claims, 13 Drawing Sheets

420

$s_0^- = (y_k > 0) \wedge \neg a_0$
$s_1^- = (y_k > 0) \wedge \neg a_1$

430

$$s_0^+ = (y_k < 0) \wedge \neg a_0$$
$$s_1^+ = (y_k < 0) \wedge \neg a_1$$

530

$$b = (y_k < 0) \wedge ((L_D \wedge (s^+ \| ((\neg v^\sim \| s^-) \wedge (L^+_{k-1} < L)))) \| (\neg L_D \wedge s^+))$$
$$b_0 = \neg s^+_{j-1,k}$$
$$b_1 = s^+_{j,k} \| \neg b$$
$$b_2 = v^+$$

SYSTEMS AND METHODS FOR NYQUIST ERROR CORRECTION

CROSS-REFERENCES TO RELATED APPLICATIONS

NOT APPLICABLE

STATEMENT AS TO RIGHTS TO INVENTIONS MADE UNDER FEDERALLY SPONSORED RESEARCH AND DEVELOPMENT

NOT APPLICABLE

REFERENCE TO A "SEQUENCE LISTING," A TABLE, OR A COMPUTER PROGRAM LISTING APPENDIX SUBMITTED ON A COMPACT DISK

NOT APPLICABLE

BACKGROUND OF THE INVENTION

The present invention is directed to communication systems and methods.

Internet and mobile applications nowadays demand a huge amount of bandwidth for transferring photos, video, music, and other multimedia files. To meet the bandwidth and capacity demands, high-speed data communication systems are deployed. Research and development efforts have been made to improve the bandwidth of communication systems. Various types of error correction mechanisms have been developed over the years.

Unfortunately, conventional systems and methods have been inadequate. Improved communication techniques are desired.

BRIEF SUMMARY OF THE INVENTION

The present invention is directed to communication systems and methods. In a specific embodiment, the present invention provides a receiver that includes an error correction module. A syndrome value, calculated based on received signals, may be used to enable the error correction module. The error correction module includes an error generator, a Nyquist error estimator, and a decoder. The decoder uses error estimation generated by the Nyquist error estimator to correct the decoded data. There are other embodiments as well.

According to an embodiment, the present invention provides a receiver device that includes an equalizer configured to provide equalized signals based on received signals. The device also includes a detector configured to generate a first decision based on the equalized signals. The device also includes a demapper configured to generate a first output based at least on the first decision. The device further includes an error correction module configured to generate a second output based on at least the first decision and an error indicator. The error correction module may include a Nyquist error estimator for generating the error indicator based at least on the equalized signals and the first decision. The device also includes a syndrome calculator configured to calculator a syndrome value based on the first output. The device also includes a selector configured to select between the first output and the second output based at least on the syndrome value.

According to another embodiment, the present invention provides an error correction device that includes an error generator configured to generate an intermediate signal based on least an input signal and a first decision. The first decision is based on the input signal. The device also includes a Nyquist error estimator that is configured to generate an error indicator using at least the intermediate signal and the first decision. The device also includes a decoder that is configured to generate an output based at least on the error indicator and the first decision. The Nyquist error estimator operates on an error event trellis with a pair of lists, and it updates the pair of lists recursively.

According to yet another embodiment, the present invention provides a method for processing received data. The method includes receiving an input signal. The method also includes equalizing the input signal to provide an equalized signal. The method also includes generating a first decision based on the equalized signal. The method also includes demapping the first decision to generate a first output. The method also includes determining a syndrome value associated with the first output. The method also includes generating a second output using an error correction process if the syndrome value is non-zero. The error correction process includes a Nyquist error estimation process. The method also includes selecting between the first output and the second output using the syndrome value.

According to yet another embodiment, the present invention provides a transmitter device that includes an RS symbol interleaver configured to generate RS symbols from RS codewords. The device also includes a first PAM-n mapper configured to generate a first set of PAM-n symbols based on the RS symbols. The device also includes a bit selector module configured to select a subset of bits from the first set of PAM-n symbols. The device also includes a parity generator configured to generate parity bits using the subset of bits. The device also includes a second PAM-n mapper configured to get a second set of PAM-n symbols using the parity bits. The device also includes a concatenation module configured to concatenate the first set of PAM-n symbols and the second set of PAM-n symbols to generate a concatenated data steam. The device also includes a pilot symbol insertion module configured to insert pilot symbols to the concatenated data stream.

It is to be appreciated that embodiments of the present invention provide many advantages over conventional techniques. Among other things, error detection and correction mechanism according to embodiments of the present invention provide meaningful and effective performance boost. In various implementations, a control logic activates error correction mechanisms only when needed, thereby saving power.

Embodiments of the present invention can be implemented in conjunction with existing systems and processes. For example, error correction techniques can be implemented in conjunction with existing systems. In various embodiments, error correction techniques may be configured on devices that are manufactured using existing manufacturing processes and techniques, and thus can be conveniently implemented. There are other benefits as well.

The present invention achieves these benefits and others in the context of known technology. However, a further understanding of the nature and advantages of the present invention may be realized by reference to the latter portions of the specification and attached drawings.

BRIEF DESCRIPTION OF THE DRAWINGS

The following diagrams are merely examples, which should not unduly limit the scope of the claims herein. One of ordinary skill in the art would recognize many other variations, modifications, and alternatives. It is also understood that the examples and embodiments described herein are for illustrative purposes only and that various modifications or changes in light thereof will be suggested to persons skilled in the art and are to be included within the spirit and purview of this process and scope of the appended claims.

DETAILED DESCRIPTION OF THE INVENTION

The present invention is directed to communication systems and methods. In a specific embodiment, the present invention provides a receiver that includes an error correction module. A syndrome value, calculated based on received signals, may be used to enable the error correction module. The error correction module includes an error generator, a Nyquist error estimator, and a decoder. The decoder uses error estimation generated by the Nyquist error estimator to correct the decoded data. There are other embodiments as well.

The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the Claims herein is not intended to invoke the provisions of 35 U.S.C. 112, Paragraph 6.

Please note, if used, the labels left, right, front, back, top, bottom, forward, reverse, clockwise and counter-clockwise have been used for convenience purposes only and are not intended to imply any particular fixed direction. Instead, they are used to reflect relative locations and/or directions between various portions of an object.

Figure 1A:
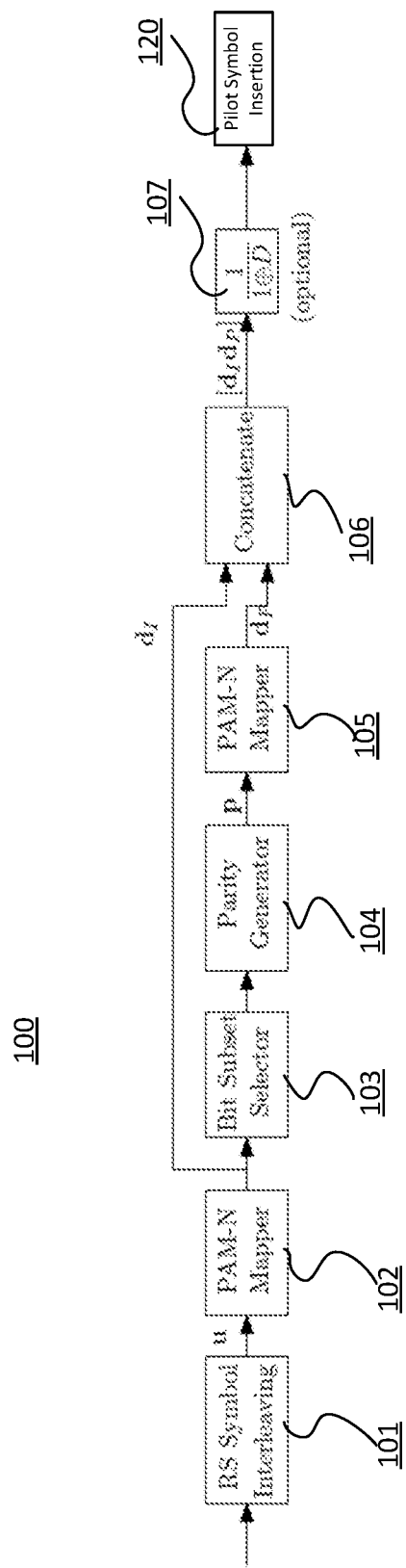
FIG. 1A is a simplified block diagram illustrating encoder 100 according to embodiments of the present invention.
Figure 1B:
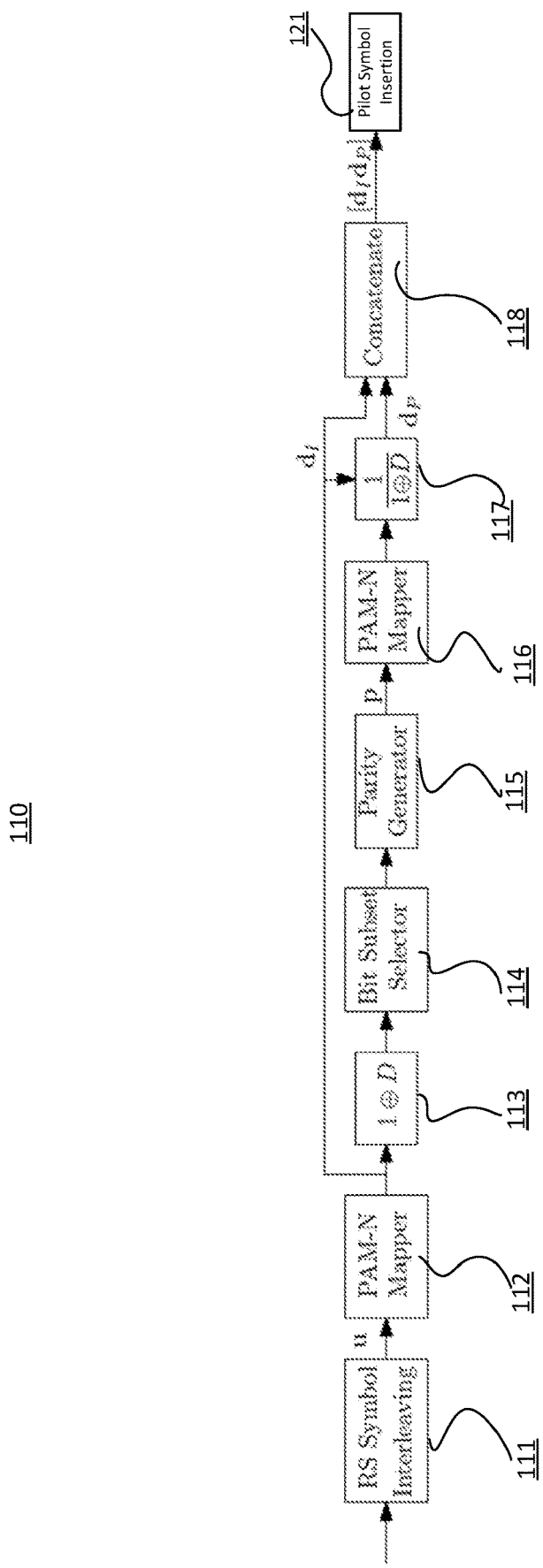
FIG. 1B is a simplified block diagram illustrating encoder 110 according to embodiments of the present invention.

In various applications, communications between two entities (i.e., a transmitter and a receiver are connected to each other via a communication link) are FEC encoded. For example, pulse-amplitude modulation (PAM) may be used. For example, the incoming traffic received by a receiver may be encoded in a concatenated FEC scheme. For example, the traffic may be first encoded by a Reed-Solomon (RS) encoder, and a suitably interleaved set of RS symbols is encoded by a second block FEC encoder. Depending on the implementation, other encoding schemes may be used as well. To balance performance and power consumption, simple block codes that are amenable to soft-decoding with a Nyquist-error-based decoding metric, such as Hamming codes or BCH codes, may be used. For example, FIGS. 1A and 1B illustrate two exemplary FEC encoding mechanisms that are appropriate for systems impaired by Nyquist error events. In both mechanisms, it is assumed that a first RS symbol interleaving block generates a payload u of m RS symbols from distinct RS codewords, followed by a first PAM-N mapper that generates a set of PAM-N symbols $d_f$.

FIG. 1A is a simplified block diagram illustrating encoder 100 according to embodiments of the present invention. This diagram is merely an example, which should not unduly limit the scope of the claims. One of ordinary skill in the art would recognize many variations, alternatives, and modifications. In various embodiments, RS symbol interleaving block 101 generates a payload u of m RS symbols from distinct RS codewords, followed by PAM-N mapper 102 that generates a set of PAM-N symbols $d_f$. Based on the $d_f$, block 103 selects a subset of the bits (from the PAM-N bit-labeling) from which to compute FEC parity bits. For example, if PAM-N mapper 102 implements a binary mapping, the subset selector 103 may select the least-significant bit of each PAM-N symbol. Based on the output of the bit subset selector, parity generator 104 (e.g., systematic linear block encoder) generates parity bits p. Parity bits p are mapped by PAM-N mapper 105. It is to be noted that PAM-N mapper 105 may implement a different mapping scheme from PAM-N mapper 102. For example, PAM-N mapper 105 may implement a Gray mapping. Concatenation is provided at block 106 that concatenate $d_f$ from block 102 and $d_p$ from block 105. Concatenated data [$d_f$, $d_p$] is processed at block 107 before transmission over the channel. For example, block 107 comprises a 1/(1⊕D) modulo-N precoder, which may be optional depending on the implementation.

To simplify the implementation of sequence detection and estimation blocks, pilot symbols may be inserted at FEC block codeword boundaries (or, after every n-th codeword, for n-th small positive integer). In a high-speed parallelized implementation, the trellis termination provided by pilot symbols significantly reduces the overlap that would otherwise be required between parallel implementations of the sequence detector. As an example, block 120 provides pilot symbol insertion. For example, pilot symbols uniquely identify the FEC encoding schemes and allows the trellis (as used by the receiver) to start and end in a known state over the span of 1 or more FEC code words.

FIG. 1B is a simplified block diagram illustrating encoder 110 according to embodiments of the present invention. This diagram is merely an example, which should not unduly limit the scope of the claims. One of ordinary skill in the art would recognize many variations, alternatives, and modifications. In various embodiments, RS symbol interleaving block 111 generates a payload u of m RS symbols from distinct RS codewords, followed by PAM-N mapper 112 that generates a set of PAM-N symbols $d_f$. Block 113 is configured to, among other things, address Nyquist error events. Due to the properties of the Nyquist error events—filtering a Nyquist error event via (1⊕D) modulo-N reduces the burst to a pair of errored symbols—it can be beneficial to generate the parity on a (1⊕D) modulo-N filtered version of the transmitted PAM-N information symbols $d_f$. In various embodiments, block 113 with (1⊕D) modulo-N filter is configured prior to the bit subset selector 114. Based on the output of the bit subset selector 114, parity generator 115 generates parity bits. Block 117 (e.g., with 1/(1 ⊕D) modulo-N precoder) is configured after PAM-N mapper 116, and its state (initialized for the first PAM-N parity symbol) is based on the last symbol in $d_f$. At block 118, the resulting pre-coded PAM-N symbols $d_p$ are concatenated with the $d_f$ for transmission. Block 121 is configured after block 118 and provides pilot symbol insertion. For example, pilot symbols uniquely identify the FEC encoding schemes and allow the trellis (as used by the receiver) to start and end in a known state over the span of 1 or more FEC code words.

Figure 2:
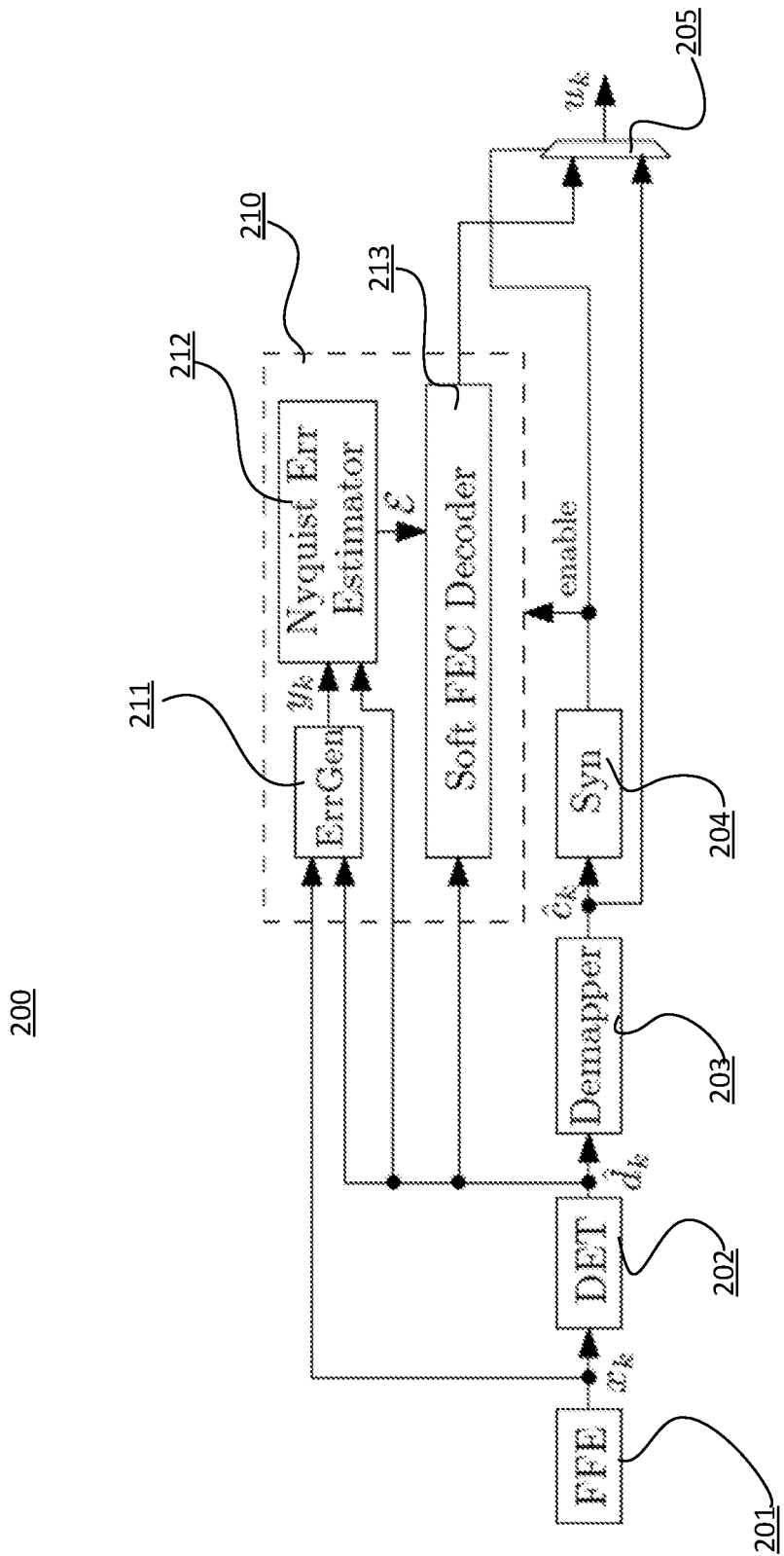
FIG. 2 is a simplified block diagram illustrating a receiver 200 according to embodiments of the present invention.

FIG. 2 is a simplified block diagram illustrating a receiver 200 according to embodiments of the present invention. This diagram is merely an example, which should not unduly limit the scope of the claims. One of ordinary skill in the art would recognize many variations, alternatives, and modifications. It to be understood that receiver 200 includes other components (e.g., optical interface, input circuit, clock recovery circuits, and others) that are not shown in FIG. 2. In various embodiments, block 201 is configured after input signals are received from an input circuit and performs equalization. It is appreciated that block 201 may be configured using various types of equalizers, including feedforward equalizer (FFE). The output of block 201, the received signal is equalized to a partial response of the form 1+αD, where 0≤α≤1 is the amplitude of the first post-cursor inter-symbol interference (ISI). For a known transmitted sequence $d_k$, the signal $x_k$ at the FFE output is defined in Equation 1 below:

$$x_k = d_k + \alpha d_{k-1} + n_k,$$ Equation 1:

where $n_k$ is an additive white Gaussian noise.

Detector 202 generates a first set of decisions $\hat{d}_k$. For example, detector 202 may be a decision-feedback equalizer (DFE), a maximum-likelihood sequence detector (MLSD), or a hybrid of multiple detector types. As an example, error-event MLSD (ee-MLSD) is a hybrid approach—a trellis-based Nyquist-error correcting scheme post-processes the FFE and DFE outputs in order to approximate an MLSD receiver—that was described in U.S. Pat. Nos. 10,637,512 and 10,404,289, both of which are commonly owned and incorporated by reference in here. Among these detectors, an assumption is that their outputs are dominated by Nyquist error events. For example, a Nyquist error event refers to a burst of consecutive decision errors (i.e., $\hat{d}_k \neq d_k$ for a range of consecutive values of k), where the polarity of the decision error alternates (e.g., +−+−+−).

Demapper 203 inverts the mapping applied in the transmitter, in order to recover a first estimate Ok of the transmitted FEC codeword bits from the $\hat{d}_k$. In various embodiments, demapper 203 may include an inverse precoder.

Block 204 calculates the syndrome of $\hat{c}_k$. If the syndrome is satisfied (i.e., all-zeros), then the payload bits from the codeword are mapped directly to the output $u_k$ (note that this is without any loss in performance whenever the detector provides decisions corresponding to the maximum likelihood sequence). When the syndrome is not satisfied (i.e., it has non-zero elements), block 210 is enabled, which includes a Nyquist-error-based sequence estimation and corresponding Nyquist-error-based soft-decision decoder. For example, block 210 may be referred to as an error correction circuit that includes error generator 211, Nyquist error estimator 212, and soft FEC decoder 213. In various embodiments, error generator 211 generates an intermediate signal $y_k$ that is based on signal $x_k$ and $\hat{d}_k$ as shown. Nyquist error estimator 212 configured to generate an error estimation using its input $y_k$ and $\hat{d}_k$. Decoder 213 is configured to generate an output $u_k$ by updating decision $\hat{d}_k$ with error estimation calculated by the Nyquist error estimator 212. Selector 205 (e.g., implemented with a multiplexor) selects output based on the syndrome calculation performed by block 204.

It is to be appreciated that receiver 200 as illustrated provides a significant advantage in power consumption, since the frequency at which the Nyquist-error-based estimation and decoding are enabled is one-quarter or less in practice, without performance degradation. Detailed description below provides a Nyquist-error-based sequence estimation and an architecture for performing soft-decision decoding with a Nyquist-error-based maximum-likelihood codeword metric.

Depending on the implementation, soft-decision estimation and decoding systems for partial response channels may include a codeword interleaver, which is configured in order to spread the burst error events across multiple codewords. In turn, if the interleaving depth is sufficient, the soft-decision decoder can assume that the input errors are independent. According to certain embodiments, interleaving over codewords is not used, at least for two reasons. First, the soft-decision estimation and decoding systems only need to be enabled when the first syndrome calculation is not satisfied (e.g., the output of block 204 used as an enable signal). Second, block 213 uses a soft-decision decoding algorithm that explicitly models the correlated Nyquist error events. The first has the advantage that it reduces power consumption in the receiver, and the second has the advantage that superior performance is achievable when the decoding algorithm accurately models the correlation of errors.

To simplify the implementation of sequence detection and estimation blocks, pilot symbols may be inserted at FEC block codeword boundaries (or, after every n-th codeword, for n a small positive integer). In a high-speed parallelized implementation, the trellis termination provided by pilot symbols significantly reduces the overlap that would otherwise be required between parallel implementations of the sequence detector.

In various embodiments, receiver 200 employs a hybrid ee-MLSD scheme that is configured as a special case of a more powerful Nyquist-error post-processing scheme, which can be suitable for both detection (i.e., hard) and estimation (i.e., soft). Different variants of the scheme can be used to perform the role of the detector (at the FFE output) and/or the Nyquist error estimator (to enable soft Nyquist-error-event-based FEC decoding).

It is also possible to simultaneously perform the functions of the detection and estimation blocks, and this can be easily accomplished by various embodiments of the disclosure. To minimize the power consumption of the receiver, it can be worthwhile to separate their implementation, especially when the estimation block can be enabled at a reduced frequency (e.g., only when the outputs of the detector fail to satisfy a syndrome checker).

Error correction block 210—with error generator 211, Nyquist error estimator 212, and soft decoder 213—uses outputs from both the FFE 201 and detector 202, as illustrated in FIG. 2. In various implementations, error signal $e_k$ is defined in Equation 2 below:

$$e_k = x_k - (\hat{d}_k + \alpha \hat{d}_{k-1}) = \quad \text{Equation 2}$$

$$2(\epsilon_k + \alpha \epsilon_{k-1}) + n_k \text{ where } \epsilon_k = \frac{d_k - \hat{d}_k}{2},$$

and for PAM-N the $d_k \in -(N-1) + 2i, 0 \leq i < N$

For a system dominated by Nyquist error events, it is assumed that $\epsilon_k \in \{0, +1, -1\}$. Additionally, whenever k and k-1 fall within the span of a Nyquist error event, $\epsilon_k = -\epsilon_{k-1}$.

To quantify the likelihood of a sequence of Nyquist error events, metric M is defined in Equation 3 below:

$$M = \Sigma_k (y_k - (\epsilon_k + \alpha \epsilon_{k-1}))^2, \text{ wherein } y_k \triangleq e_k/2 \quad \text{Equation 3:}$$

When performing the function of a sequence detector, we wish to find the error sequence $\epsilon_k$ that minimizes M, subject to the constraint that $|d_k + 2\epsilon_k| \leq (N-1), \forall k$. Note that the error sequence $\epsilon_k$ may consist of multiple non-overlapping Nyquist error events. It is to be appreciated that detection formulation is appropriate at the FFE output, for the purpose of minimizing the probability of symbol error when generating the set of hard decisions.

To determine the reliability of each detector decision (e.g., to enable soft-decision decoding of an FEC code), calculations are needed to provide a list of sequences (and their associated metrics) that provide the second-best, third best (and so on) metrics. Depending on the soft decoder implementation, the list of error sequences may be converted into a reliability measure for each UI. In various embodiments, Nyquist error estimation is determined using a trellis.

Figure 3:
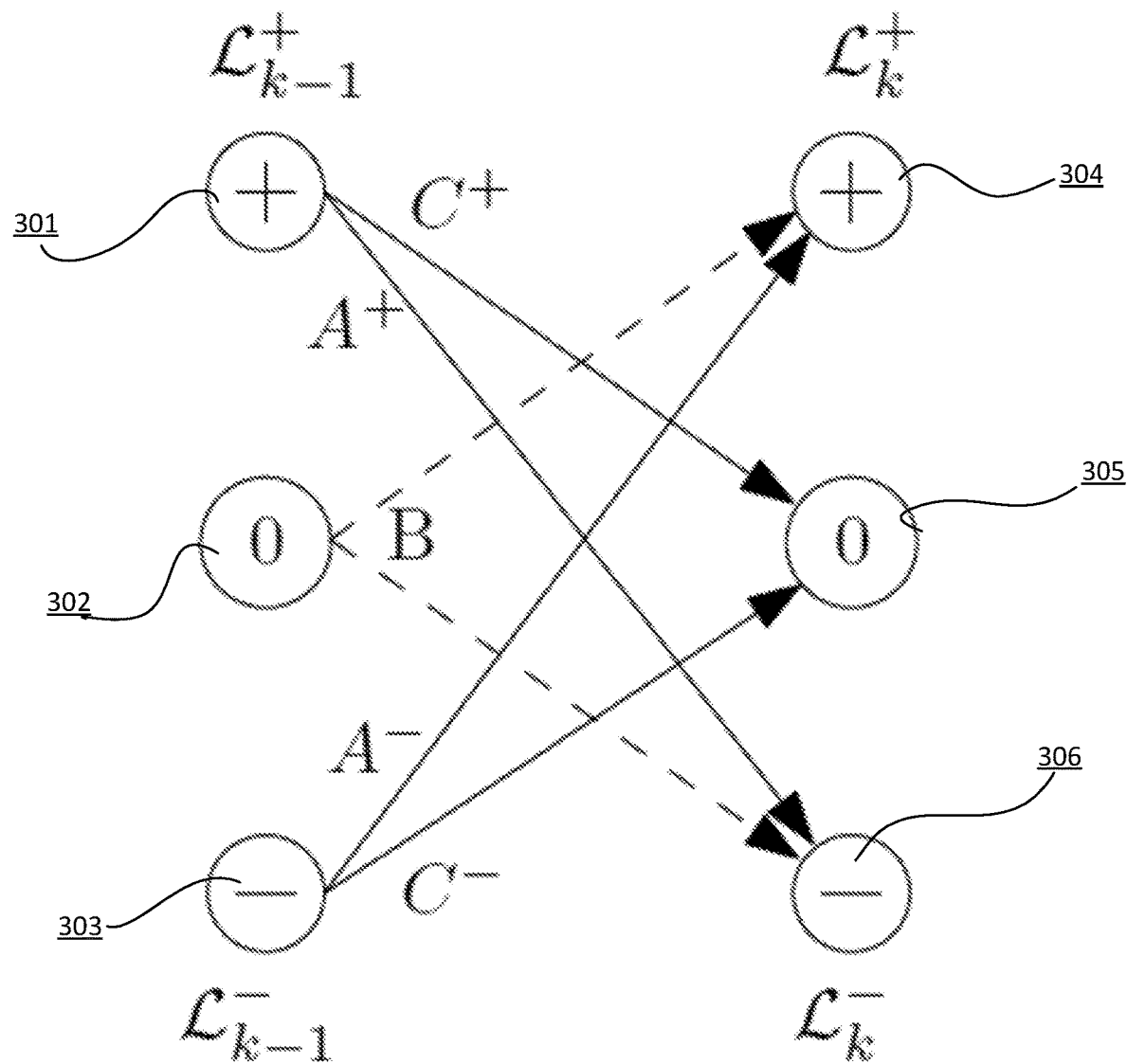
FIG. 3 is a simplified diagram illustrating trellis 300 for a Nyquist error estimator according to embodiments of the present invention.

FIG. 3 is a simplified diagram illustrating trellis 300 for a Nyquist error estimator according to embodiments of the present invention. This diagram is merely an example, which should not unduly limit the scope of the claims. One of ordinary skill in the art would recognize many variations, alternatives, and modifications. Following the definition of a Nyquist error event, the detection and estimation schemes can be interpreted to operate on a trellis 300 with three states. The "0" state is the state from/to which Nyquist error events begin/terminate. At any fixed time k, there may be a valid error sequence that transitions from "0" (node 302) at time k-1 into "+1" (node 304) at time k, or from "0" (node 302) to "-1" (node 306), or neither. At any fixed time k, there are valid error sequences from "+1" (node 301) that terminate in state "0" (node 305). Similarly, there are valid error sequences from "-1" (node 303) that terminate in state "0" (node 306).

As an example, Nyquist-error-based detection and estimation schemes are described in terms of a pair of lists, $\mathcal{L}_k^+$ and $\mathcal{L}_k^-$, that are updated recursively at each time k. The list $\mathcal{L}_k^+$ consists of the elements $\{1_{1,k}^+, 1_{2,k}^+, \ldots, 1_{L_k^+,k}^+\}$. Each of the $1_{j,k}^+$ is a 3-tuple $(i_{j,k}, s_{j,k}, M_{j,k})$, where $i_{j,k}$ is the time index associated with the start of a Nyquist error event, $s_{j,k}$ is the sign of the associated error at time $i_{j,k}$, and $M_{j,k}$ is the path metric.

For example, the following notations are made:

$$l_{j,k}^+(3) = M_{j,k} \text{ and } l_{j,k}^+(i_{j,k}, s_{j,k}).$$

The elements of $\mathcal{L}_k^-$ are ordered in the following sense:

$$\text{if } 1 \leq m < n \leq L_k^+, \text{ then } M_{m,k} \leftarrow M_{n,k}$$

Analogously, the list $\mathcal{L}_k^-$ consists of the elements $\{1_{1,k}^-, 1_{2,k}^-, \ldots, 1_{L_k^-,k}^-\}$, with the same properties and definitions of $\mathcal{L}_k^+$. In the following, it is assumed that $L \triangleq L_k^+ + L_k^-$ is constant.

In the formula to follow, we interpret the $\wedge$ operator to represent logical AND, the $\|$ operator to represent logical OR, and the $\neg$ operator to represent logical negation. There is a set of variables whose values can be computed directly from the inputs $y_k$ and $\hat{d}_k$, which are referred to as 'independent' calculations since they do not depend on the state metrics. In practice, this means that they can be pre-computed, which removes them from the critical path.

There are also dependent variables that cannot be determined unless the state metrics are known; they are referred to as "dependent" variables determined by "dependent" calculations using state metrics. The variables include:

$$B = 1 - 2|y_k|$$

$$A^+ = (1-\alpha)^2 + 2(1-\alpha)y_k$$

$$A^- = (1-\alpha)^2 - 2(1-\alpha)y_k$$

$$C^+ = \alpha^2 - 2\alpha y_k$$

$$C^- = \alpha^2 + 2\alpha y_k$$

$$v^+ = (\hat{d}_k - 2) \geq -(N-1)$$

$$v^- = (\hat{d}_k + 2) \overset{?}{\leq} (N-1)$$

$$s_{j,k}^+ = (l_{j,k-1}^+(3) + A^+) \overset{?}{<} B, j \in [1, L_{k-1}^+]$$

$$s_{j,k}^- = (l_{j,k-1}^-(3) + A^-) \overset{?}{<} B, j \in [1, L_{k-1}^-]$$

$$i_k^+ = 1 + \sum_{j=1}^{L_{k-1}^+} s_{j,k}^+$$

$$i_k^- = 1 + \sum_{j=1}^{L_{k-1}^-} s_{j,k}^-$$

$$s^+ = \begin{cases} \neg s_{L_{k-1}^+,k}^+ & : L_{k-1}^+ > 0 \\ 1 & : L_{k-1}^+ = 0 \end{cases}$$

$$s^- = \begin{cases} \neg s_{L_{k-1}^-,k}^- & : L_{k-1}^- > 0 \\ 1 & : L_{k-1}^- = 0 \end{cases}$$

$$D^- = \begin{cases} l_{1,k-1}^-(3) + C^- & : L_{k-1}^- > 0 \\ \infty & : L_{k-1}^- = 0 \end{cases}$$

-continued $$D^+ = \begin{cases} l^+_{1,k-1}(3) + C^+ & : L^+_{k-1} > 0 \\ \infty & : L^+_{k-1} = 0 \end{cases}$$

$$D = \min\{0, D^-, D^+\}$$

$$q = \begin{cases} 0 & : L^+_{k-1} = 0 \\ 1 & : L^+_{k-1} = L \\ (l^-_{L^-_{k-1},k-1}(3) + A^-)^? < (l^+_{L^+_{k-1},k-1}(3) + A^+) & : 0 < L^+_{k-1} < L \end{cases}$$

Figure 4A:
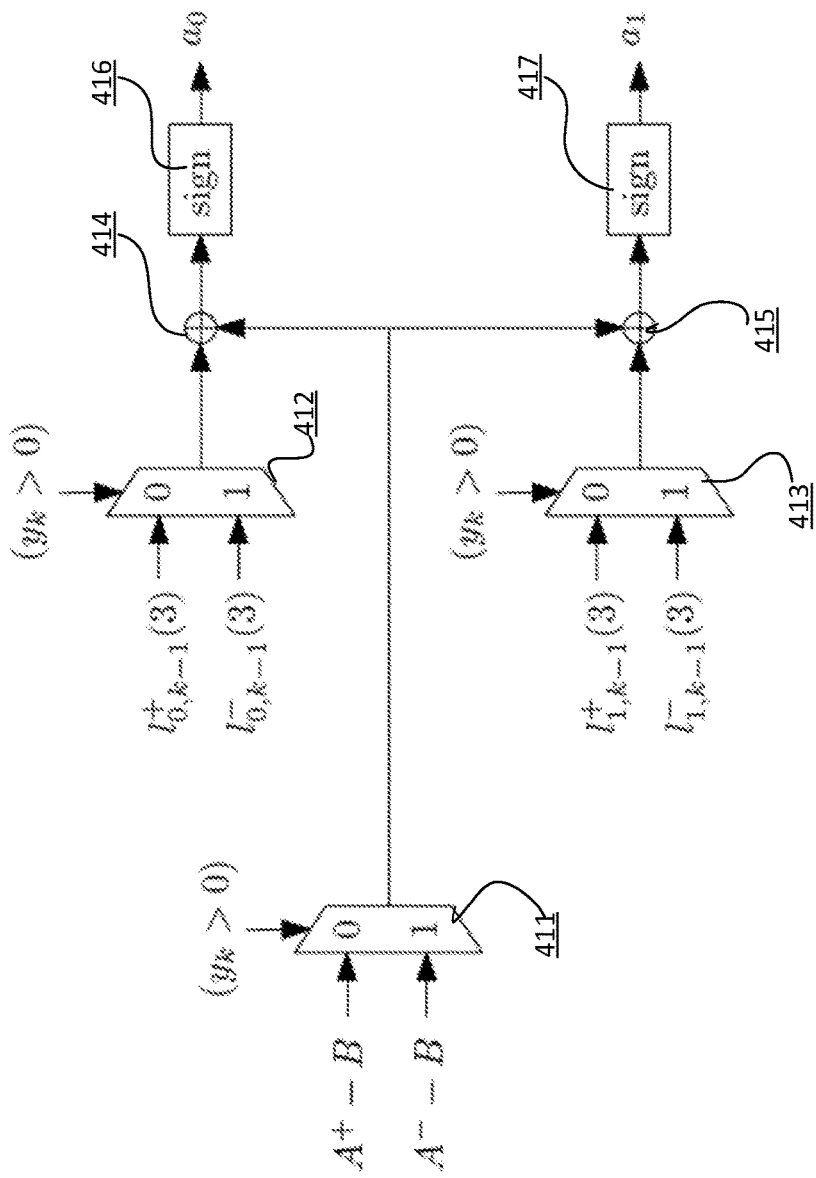
FIGS. 4A-C are simplified diagrams illustrating list calculations using multiplexors according to embodiments of the present invention.
Figure 4B:
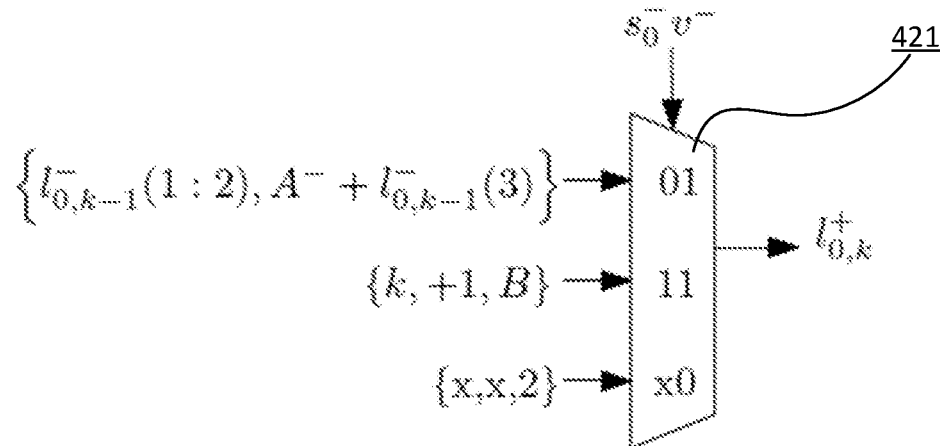
Figure 4B:
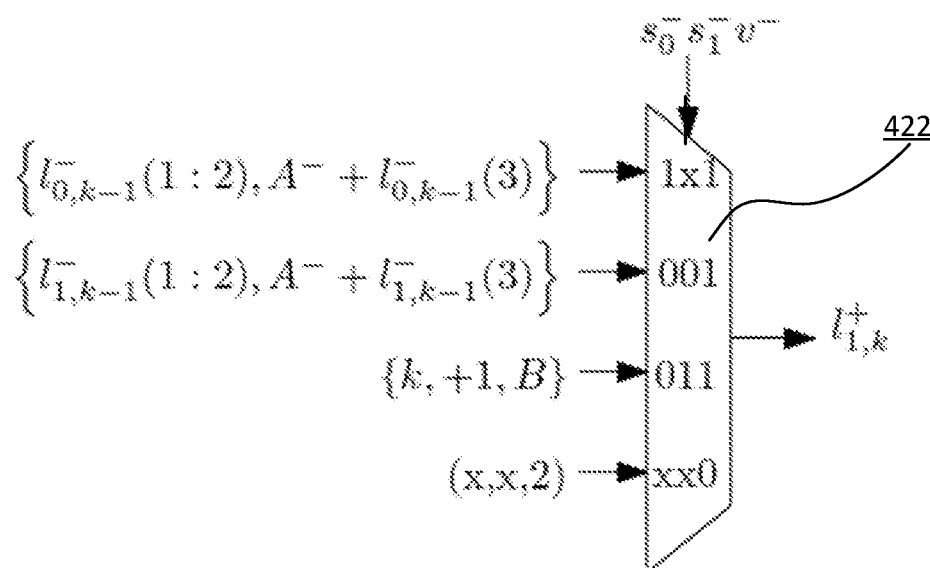
Figure 4C:
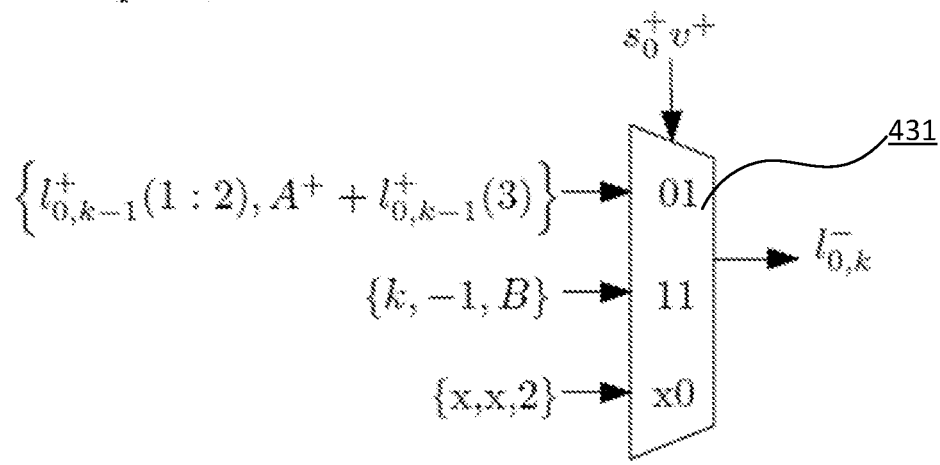
Figure 4C:
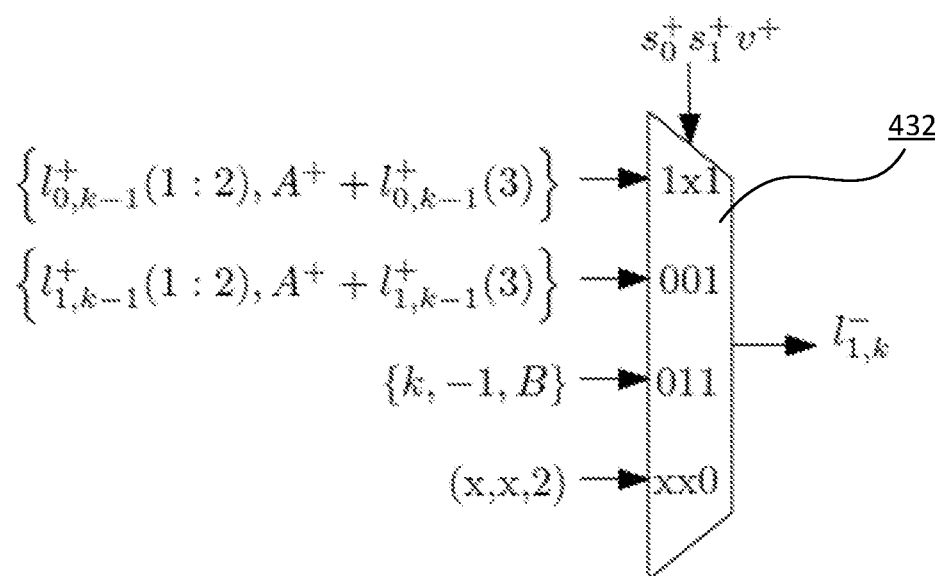

In order to optimize the power consumption and area of the implementation, we wish to minimize the sum of the lengths of the lists $\mathcal{L}_k^+$ and $\mathcal{L}_k^-$, since the required amount of calculation scales linearly with the sum of their lengths. On the other hand, for a fixed sum of list lengths L, the calculation ensures that the L most likely 'unterminated' error events are enumerated in the pair of lists. The notion of dynamic list lengths is used: at every unit interval (UI) k, the list lengths are adjusted and subject to the constraint $\mathcal{L}_k^+ \mathcal{L}_k^- = L$. Note that since only one new error event can begin at a fixed time k, the length of a list can only change by at most one element per unit time. To control whether dynamic list lengths is enabled, the Boolean variable $L_D$ is used:

when true, list lengths are adjusted dynamically;
when false, $L_k^+ = L_{k-1}^-, \forall k$ FIGS. 4A-C are simplified diagrams illustrating updating trellis metrics using multiplexors according to embodiments of the present invention. This diagram is merely an example, which should not unduly limit the scope of the claims. One of ordinary skill in the art would recognize many variations, alternatives, and modifications. As shown in FIG. 4A, a trellis path (e.g., trellis 300) is navigated using mux selectors 411, 412, and 413, whose selection is based on the result of operation $y_k > 0$. Operators 414 and 415 combine the outputs of these selectors as shown. At the outputs of sign operators 416 and 417 are variables $a_0$ and $a_1$ respectively. Variables $a_0$ and $a_1$ are used for updating lists $l_{0,k-1}^+$ and $l_{1,k-1}^+$ as shown in FIG. 4B. Variables $s_0^+$ and $s_0^-$ are both calculated using variables $a_0$ and $a_1$ respectively, and they are used as the conditions for mux selectors 421 and 422 in the outputting $l_{0,k-1}^+$ and $l_{1,k-1}^+$. Similarly, variables $a_0$ and $a_1$ are used for updating lists $l_{0,k-1}^-$ and $l_{1,k-1}^-$ as shown in FIG. 4B. Variables $s_0^+$ and $s_0^-$ are both calculated using variables $a_0$ and $a_1$ respectively, and they are used as the conditions for mux selectors 431 and 432 in the outputting $l_{0,k}^-$ and $l_{1,k}^-$.

As an example, below are the trellis output:

If $C^- + l_{0,k-1}^-(3) < \Gamma$, then insert $\{l_{0,k-1}^-(1:2), C^- + l_{0,k-1}^-(3), k\}$ into ee-buffer If $C^- + l_{1,k-1}^-(3) < \Gamma$, then insert $\{l_{1,k-1}^-(1:2), C^- + l_{1,k-1}^-(3), k\}$ into ee-buffer If $C^+ + l_{0,k-1}^+(3) < \Gamma$, then insert $\{l_{0,k-1}^+(1:2), C^- + l_{0,k-1}^+(3), k\}$ into ee-buffer If $C^+ + l_{1,k-1}^+(3) < \Gamma$, then insert $\{l_{1,k-1}^+(1:2), C^- + l_{1,k-1}^+(3), k\}$ into ee-buffer In various implementations, the ee-buffer is configured as a part of a soft decoder (e.g., decoder 213 in FIG. 2. For example, the soft decoder is configured to perform the following steps:

1. Find L elements in the ee-buffer with the smallest metrics, and denote these by $\mathcal{E}$;
2. For each of the L elements in $\mathcal{E}$, flip the corresponding PAM symbols and compute syndrome. If syndrome is zero, check if the associated metric is better than the current best;
3. For each pair of elements in $\mathcal{E}$, flip the corresponding PAM symbols and compute syndrome. If syndrome is zero and the error events are non-overlapping, check if the associated metric (i.e., the sum of the metrics from each element of the pair) is better than the current best metric; and
4. Output the bits associated with the valid codeword with the best metric. If no valid codewords are determined, output the hard decisions from Demapper 203.

It is to be appreciated that soft decoders can be implemented in various ways, as described in further detail below.

Figure 5A:
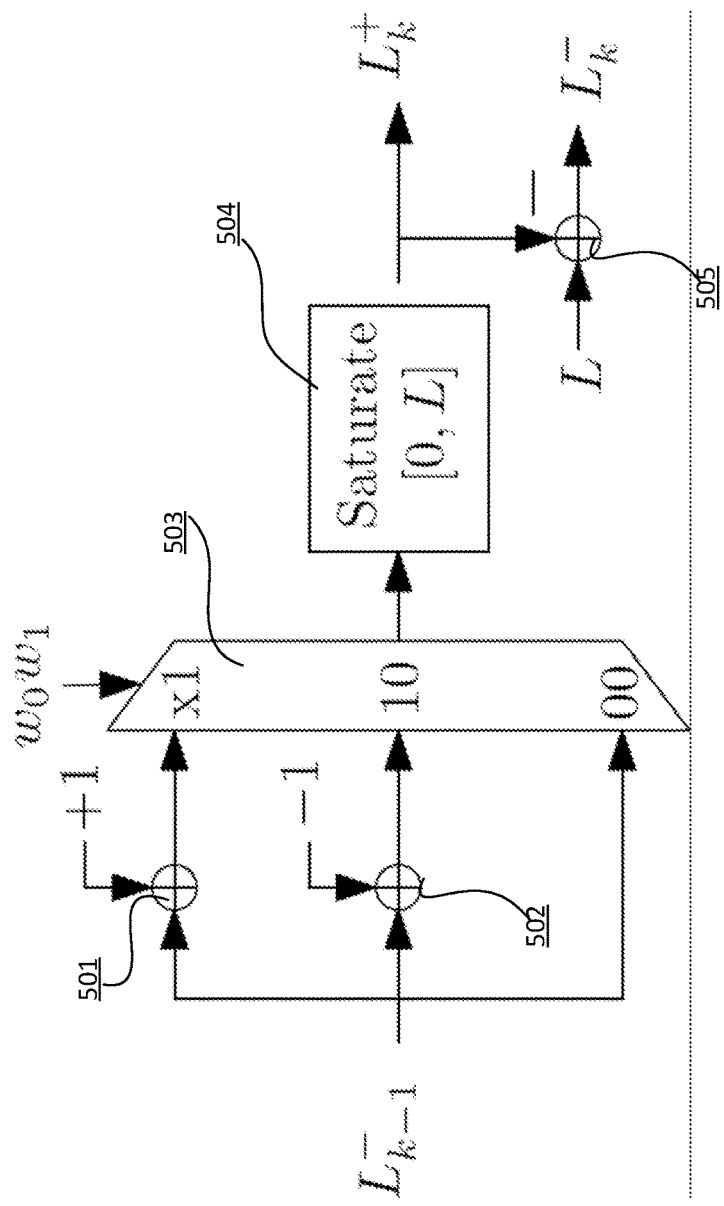
FIGS. 5A-C are simplified diagrams illustrating dependent calculations using multiplexors according to embodiments of the present invention

As an example, the process of updating list lengths is determined using the process below:

if $L_D$ then
  if $v^- \wedge (y_k > 0) \wedge (\neg q^+ \| (q \wedge s^+))$ then
    $L_k^+ = \min\{L_{k-1}^- + 1, L\}$
  else if $v^+ \wedge (y_k < 0) \wedge (\neg v^- \| (\neg q \wedge s^-))$ then
    $L_k^+ = \max\{L_{k-1}^- - 1, 0\}$
  else
    $L_k^+ = L_{k-1}^-$.
  end if
end if As an example, the above process of updating list lengths is executed by module 500 in FIG. 5A, wherein mux selector 503 selects its output based on variables $w_0 w_1$, which implements the "if" conditions.

Figure 5B:
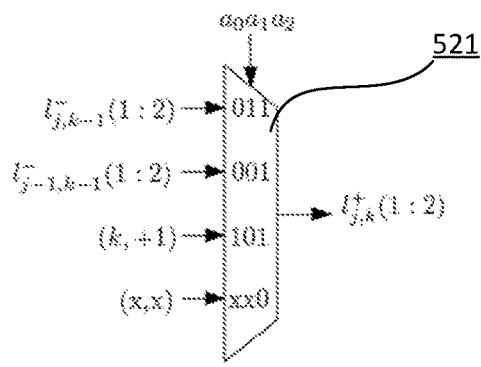
Figure 5B:
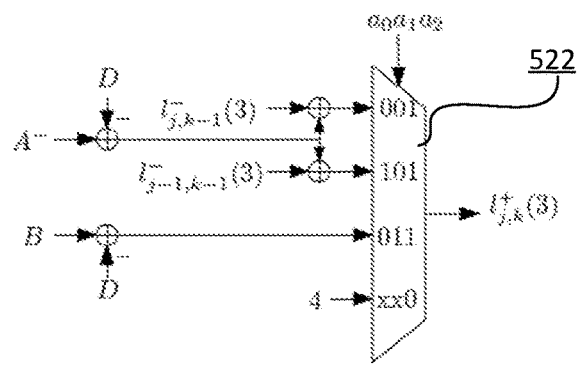
Figure 5C:
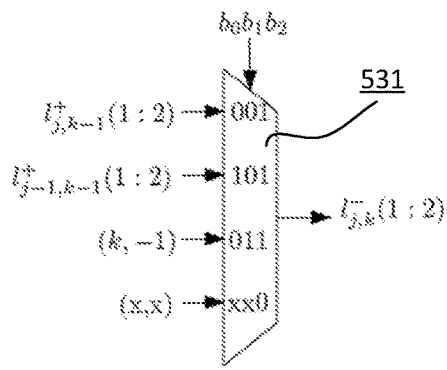
Figure 5C:
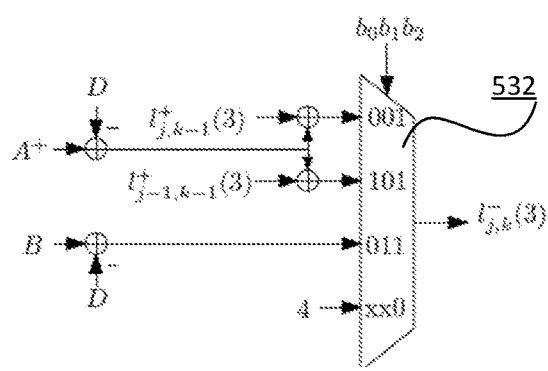
Figure 6A:
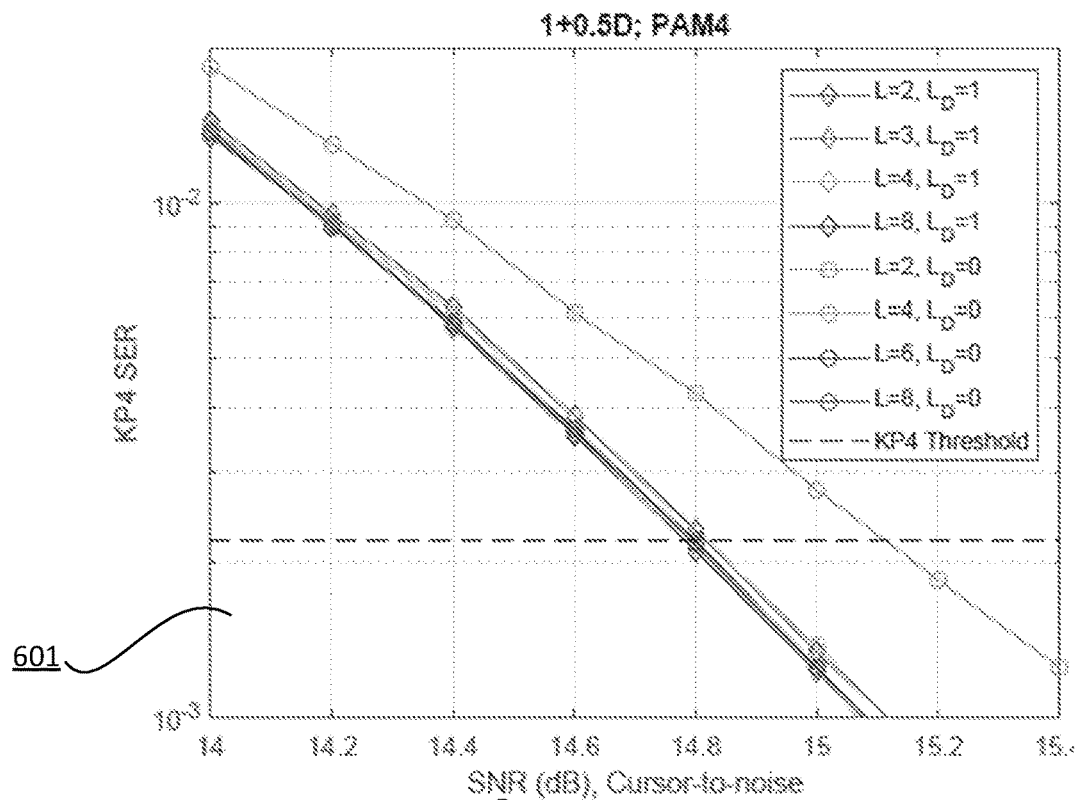
FIGS. 6A-E are plots illustrating the performance of a Nyquist error estimator at different settings.
Figure 6B:
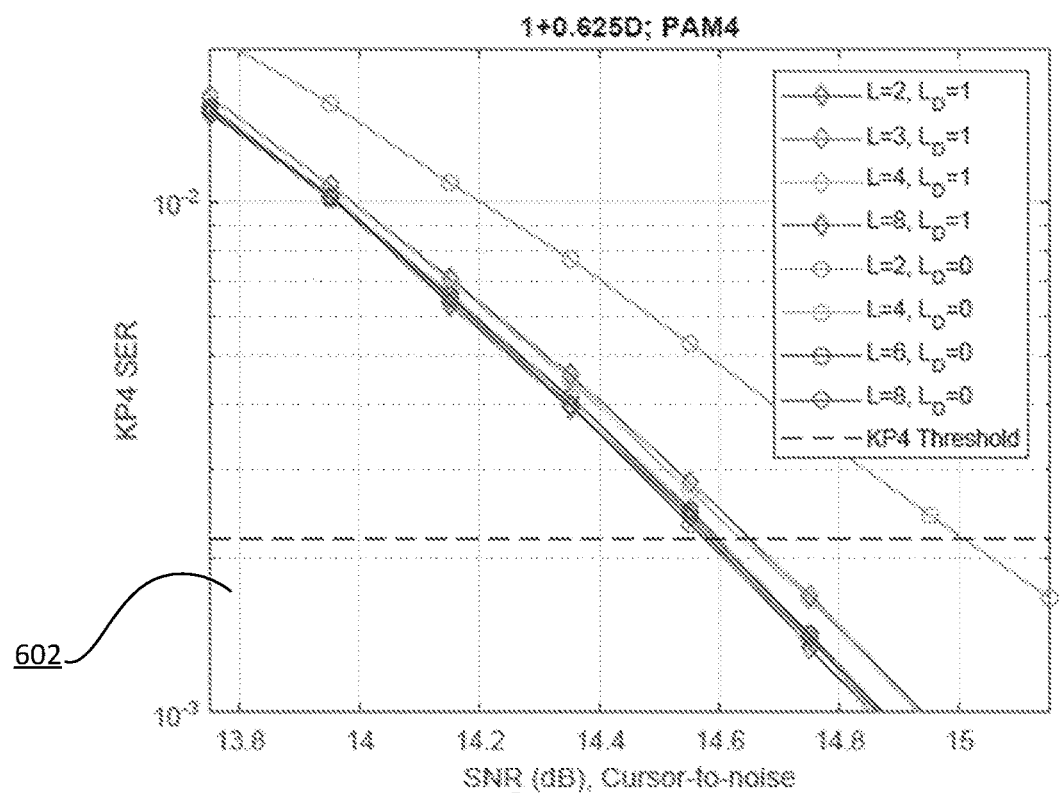
Figure 6C:
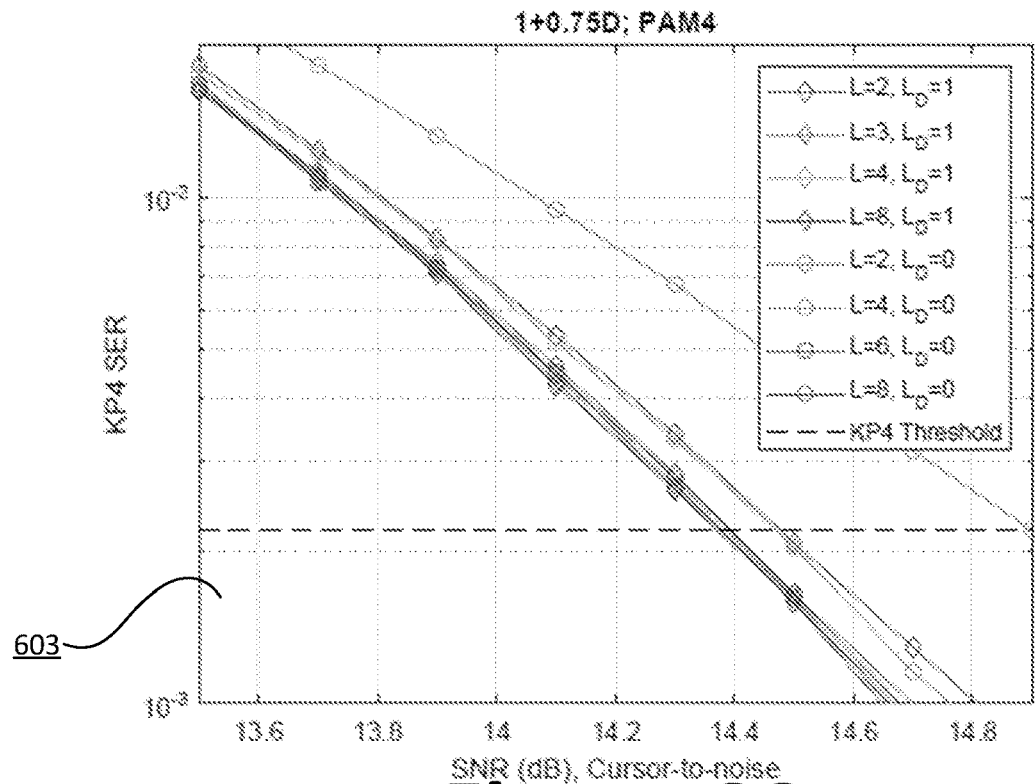
Figure 6D:
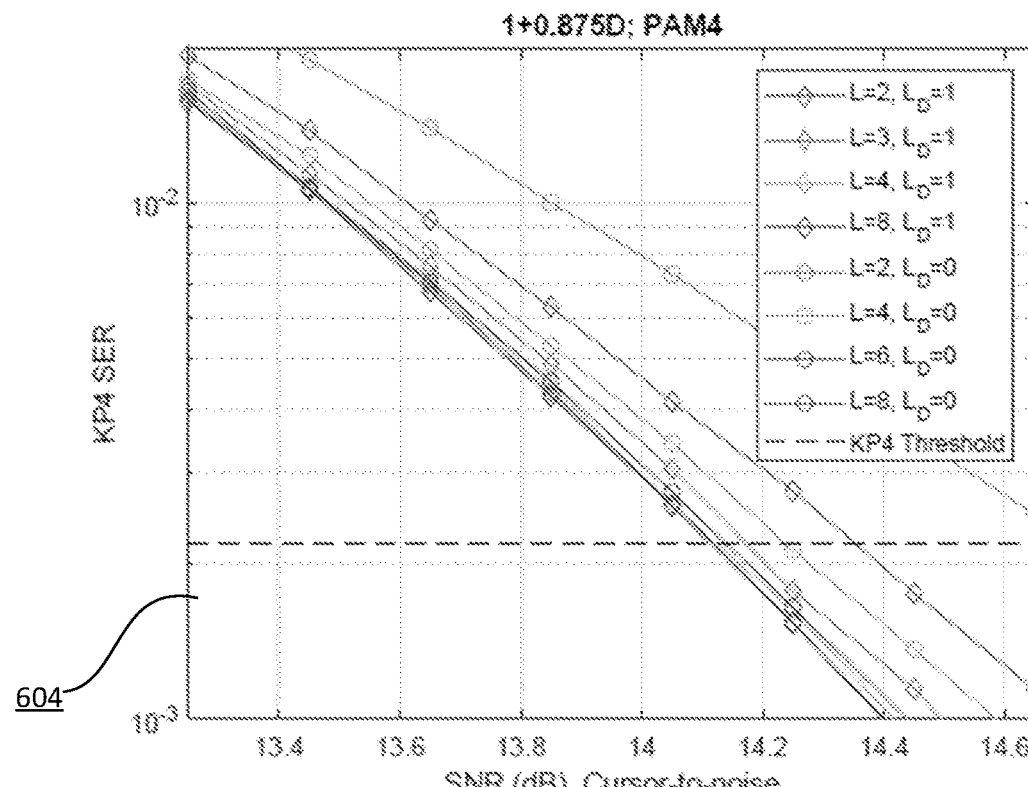
Figure 6E:
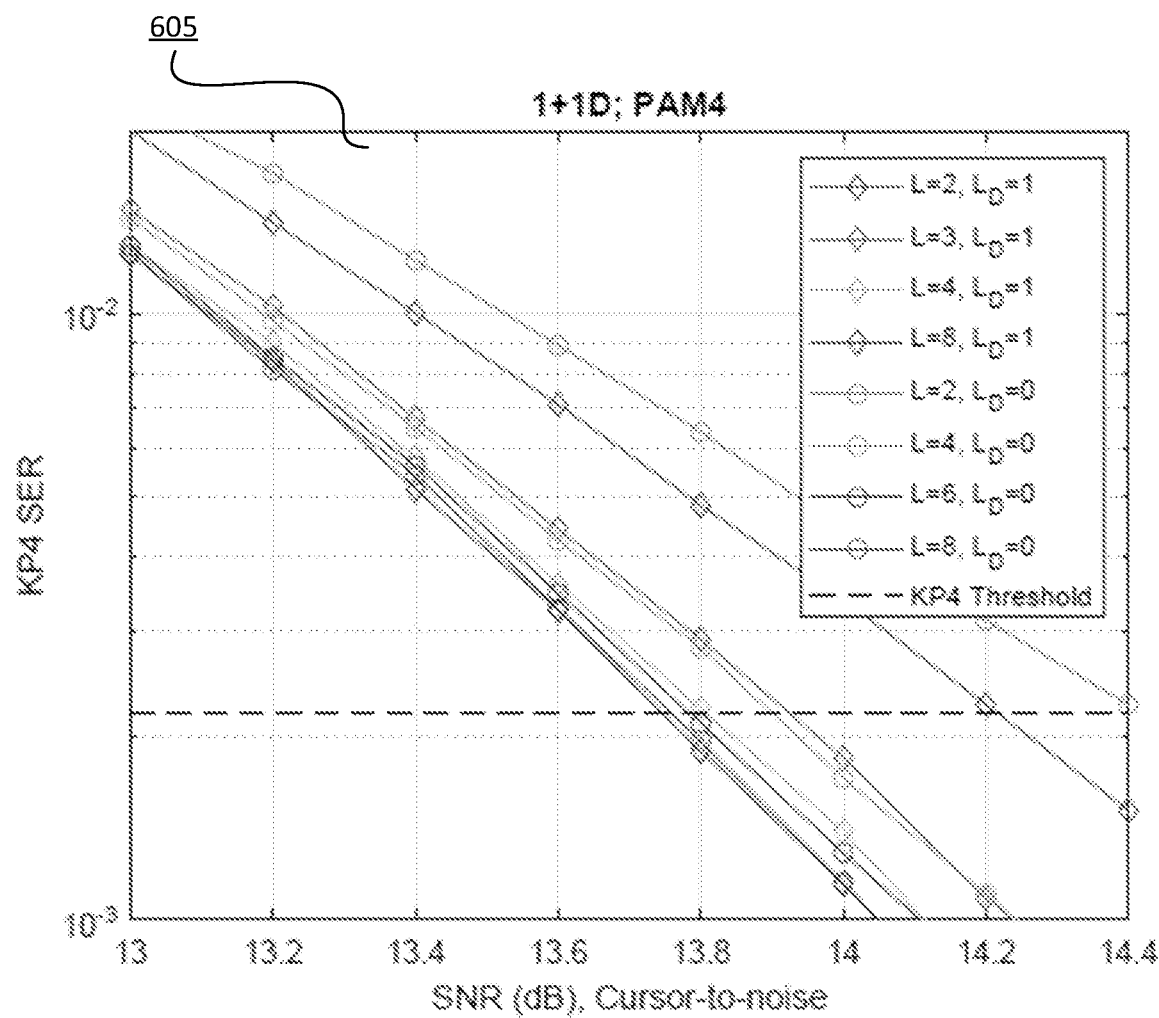

List update equations, which may be implemented with mux selectors illustrated in FIGS. 5B and 5C, may be used to update the pair of lists for the trellis. For example, at every time step k, lists $\mathcal{L}_k^+$ and $\mathcal{L}_k^-$ are updated. Intuitively, the process starts with a comparison as to whether the error event beginning at time k is more likely than the continuation of a competing error event enumerated at time k−1. When the list lengths are dynamically calculated (i.e., $L_D = 1$), the next step is to ensure that the list element that is deleted is the element (from either list) with the largest metric. When it is determined that an error event beginning at time k is to be added, it is inserted into the appropriate position of the relevant list; this ensures that the lists always remain sorted with respect to their metrics.

As an example, the list $\mathcal{L}_k^+$ may be updated using the process (e.g., in the form of pseudo code) below, which may be implemented using mux selectors 521 and 522 illustrated in FIG. 5B.

if $e^-$ then if $(y_k > 0) \wedge ((L_D \wedge (s^- \| ((\neg \omega^+ \| s^+) \wedge (L_{k-1}^+ > 0)))) \| (\neg L_D \wedge s^-))$ then $$l_{j,k}^+ = \begin{cases} (l_{j,k-1}^-(1:2), l_{j,k-1}^-(3) + A^- - D) & : 1 \le j \le i_k^- - 1 \\ (k, +1, B - D) & : j = i_k^- \\ (l_{j-1,k-1}^-(1:2), l_{j-1,k-1}^-(3) + A^- - D) & : i_k^- + 1 \le j \le L_k^+ \end{cases}$$

else $$l_{j,k}^+ = (l_{j-1,k-1}^-(1:2), l_{j-1,k-1}^-(3) + A^- - D) : 1 \le j \le L_k^+$$

end if else $$l_{j,k}^+ = (x, x, \infty) : 1 \le j \le L_k^+$$

end if

Similarly, the list $\mathcal{L}_k^-$ may be updated using the process (e.g., in the form of pseudo code) below, which may be implemented using mux selectors 531 and 532 illustrated in FIG. 5C:

if $e^+$ then if $(y_k < 0) \wedge ((L_D \wedge (s^+ \| ((-\omega^- \| s^-) \wedge (L_{k-1}^+ < L)))) \| (-L_D \wedge s^+))$ then $$l_{j,k}^- = \begin{cases} (l_{j,k-1}^+(1:2), l_{j,k-1}^+(3) + A^+ - D) & : 1 \le j \le i_k^+ - 1 \\ (k, -1, B - D) & : j = i_k^+ \\ (l_{j-1,k-1}^+(1:2), l_{j-1,k-1}^+(3) + A^+ - D) & : i_k^+ + 1 \le j \le L_k^- \end{cases}$$

else $l_{j,k}^- = (l_{j,k-1}^+(1:2), l_{j,k-1}^+(3) + A^+ - D) : 1 \le j \le L_k^-$ end if else $l_{j,k}^- = (x, x, \infty) : 1 \le j \le L_k^-$ end if There are various implementation considerations. For example, the appearance of D in the list update equations arises from the fact that when a path merging into the '0' state with negative metric is determined, future error events emerging from the '0' state need to be preferred relative to any surviving error events that did not pass through the same '0' state.

When the input decisions $\hat{d}_k$ are the maximum likelihood decisions, then D=0 (all error events will have non-negative metrics). This reduces the critical path of the list update equations in estimation-based applications with a first detector that generates MLSD decisions. In this case, the critical path may then be dominated by the calculation of q, which is only required if dynamic list lengths are computed (i.e., $L_D=1$).

At each time k, each of the L paths that were unterminated at time k−1 can merge into the error-free state; the corresponding Nyquist error events terminate at time k. The path metrics associated with the terminating error events can be calculated in various ways. For example, for each element in $\mathcal{L}_{k-1}^+$, the metric of the path terminating at time k is described in Equation 4 below:

$$M_j^+ = l_{j,k-1}^+ + C^+ \quad \text{Equation 4:}$$

Similarly for each element in the metric of the path terminating at time k is described in Equation 5 below:

$$M_j^- = l_{j,k-1}^- + C^- \quad \text{Equation 5:}$$

In principle, a list $E_k$ can be stored for each time k that consists of some subset of the paths terminating at time k. Each element of $E_k$ includes the start index, the sign of the start of the Nyquist error, and the metric of the terminating path; the terminating index of the Nyquist error event is implied. Note that the number of elements in the $E_k$ need not be equal to L. One of the approaches to minimize complexity is to add to $E_k$ the elements from either the paths emanating from the "+1" or the "−1" error state, but not both. The choice of which set of paths to add can be determined by comparing the metric of the most likely error event from each state.

The proposed Nyquist-error-based soft-decision FEC decoder (e.g., decoder 213 in FIG. 2) only requires that the N most likely Nyquist error events over the span of the FEC codeword be determined. This can be accomplished by tracing-through the $E_k$ for k in the span of the FEC codeword boundaries, and storing a list of the N error events with the smallest metrics. In practice, this consists of merging sorted lists at each k, discarding all but the N most likely at each k. It is to be noted that calculation of the trellis outputs (and any post-processing) is decoupled from the list update equations, and thus does not contribute to their critical path.

There are certain special implementations of the Nyquist estimation process described above. First, when L=1 and $L_D=1$, implementation complexity is at a minimum, but the performance is degraded for α close to unity. The degradation in performance is eliminated when L=2 and $L_D=0$. However, note that the critical path of the resulting implementation may be increased, due to the appearance of D in the update equations, which in turn implies that a difference of path metrics must be computed. In the special case of L=1 and $L_D=1$, the difference of path metrics reduces to zero (since it is the difference of the only listed metric with itself), and thus the critical path is shorter. In practice, the degradation in performance due to forcing D=0 may be minor, in which case the increase in critical path can be avoided. In both cases, a trellis trace-back scheme can be used to generate the most likely error sequence.

In certain implementations, a maximum sequence likelihood or a maximum symbol likelihood can be performed by post-processing $\mathcal{E}$. In the case of maximum symbol likelihood, an input decision $\hat{d}_k$ is flipped if its index falls within the span of a Nyquist error event for which the metric is negative; if it falls within the span of multiple Nyquist error events with negative metrics, then it should be flipped based on the error event with the smallest metric. In the case of maximum sequence likelihood, $\mathcal{E}$ is post-processed to determine the set of non-overlapping Nyquist error events (with negative metrics) whose metrics sum to the smallest metric. The resulting set of error events is used to flip the corresponding values of $\hat{d}_k$. A greedy algorithm (closely approximating the optimal post-processor) consists of purging $\mathcal{E}$ from any Nyquist error events that intersect with the most likely Nyquist error event, and then similarly purging with respect to the second most likely remaining path, and so on.

It is to be appreciated that Nyquist-error-based soft-decision FEC decoder only requires that the N most likely Nyquist error events (over the span of the FEC codeword) be determined (i.e., the list $\mathcal{E}$ described above). More generally, the trellis outputs $E_k$ (or the compressed list $\mathcal{E}$) can be used to directly calculate an approximation to the maximum a posteriori probability (MAP) of each symbol. The MAP estimation (in log-likelihood form) of the transmitted symbol at time k can be expressed in Equation 6 below:

$$\Lambda_k = \ln \left( \frac{\sum_{e:e_k=0} P(\hat{d} + e | x)}{\sum_{e:e_k \neq 0} P(\hat{d} + e | x)} \right) \quad \text{Equation 6}$$

An approximation of Equation 6 is expressed in Equation 7 below:

$$\Lambda_k \approx \ln\left(\frac{\max_{e:e_k=0} P(\hat{d}+e|x)}{\max_{e:e_k \neq 0} P(\hat{d}+e|x)}\right) \qquad \text{Equation 7}$$

where $\hat{d}$ is the sequence of decisions from the detector at the FFE output, x is the sequence of FFE outputs, and e is the set of all Nyquist error events. Since $P(\hat{d}+e|x)$ is proportional to the squared Euclidean distance between $(\hat{d}+e)$ and x, the MAP estimator can be approximated by the metric of the most likely Nyquist error event that spans k.

The Nyquist error estimation techniques, as implemented in various embodiments, can be generalized to applications with nonlinearities; the error generation block and the equations that describe the branch metrics (i.e., $A^+$, $A^-$, B, $C^+$, $C^-$) are modeled for the applications. For example, Equation 8 below describes a generalized channel model:

$$x_k = d_k + \alpha d_{k-1} + g(d_k, d_{k-1}) + n_k \qquad \text{Equation 8}$$

where $g(d_k, d_{k-1})$ represents a nonlinear intersymbol interference.

In various implementations, Nyquist error estimation is implemented for a system that uses PAM for communication. For simplicity of the description, it is assumed that the system implements PAM-4, although the approach applies to any PAM-N. It is useful to differentiate two types of nonlinearities. First, we assume the following:

$$d_k \in \{-3, -1+\delta_0, 1+\delta_1, 3\}$$

where $\delta_0$ and $\delta_1$ model the non-uniform spacing of PAM-4 levels. This is a memoryless nonlinearity. Second, the $g(d_k, d_{k-1})$ represents nonlinearities with memory (e.g., a term of the form $\beta d_k, d_{k-1}$. It is to be noted that, in principle, both forms of nonlinearity could be absorbed into the definition of $g(d_k, d_{k-1})$, but for implementation reasons, it is preferred to consider them separately. Due to the non-uniform spacing of the PAM-4 levels, the definition of $\in_k$ is described in Equation 9 below:

$$\in_k = s_k \cdot (1 + \gamma_{a(k)}) \qquad \text{Equation 9}$$

where $s_k \in \pm 1$ is the sign of the error, a(k) denotes the sub-eye index corresponding to $\hat{d}$, and the $\gamma$ account for the non-uniform spacing of PAM-4 levels.

For PAM-4, a(k)=0 when $\hat{d}=0$, or when $\hat{d}=1$ and $y_k<0$; a(k)=1 when $\hat{d}=1$ and $y_k>0$, or when $\hat{d}=2$ and $y_k<0$; a(k)=2 when $\hat{d}=2$ and $y_k>0$, or when $\hat{d}=3$. Analogously, $\gamma_0=\delta_0/2$, $\gamma_1=(\delta_1-\delta_0)/2$, and $\gamma_1=-\delta_1/2$. The error signal may be described in Equation 10 below:

$$e_k = x_k - (\hat{d}_k + \alpha \hat{d}_{k-1} + g(\hat{d}_k, \hat{d}_{k-1})) = \qquad \text{Equation 10}$$
$$2\left(\in_k + \alpha \in_{k-1} + \frac{g(d_k, d_{k-1}) - g(\hat{d}_k, \hat{d}_{k-1})}{2}\right) + n_k$$

The resulting generalized form of the 'independent' calculations are provided below:

$$B = 1 - 2|y_k| - 2(|y_k|-1)\beta + \beta^2; s_k - \text{sign}(y_k);$$

$$\beta = \delta_{a(k)} + s_k \cdot \frac{g(\hat{d}_k + 2s_k, \hat{d}_{k-1}) - g(\hat{d}_k, \hat{d}_{k-1})}{2}$$

$$A^+ = (1-\alpha)^2 + 2(1-\alpha)y_k - 2(y_k + 1 - \alpha)\beta + \beta^2;$$

$$\beta = \alpha\delta_{a(k-1)} - \delta_{a(k)} + \frac{g(\hat{d}_k + 2\hat{d}_{k-1} + 2) - g(\hat{d}_k, \hat{d}_{k-1})}{2}$$

$$A^- = (1-\alpha)^2 + 2(1-\alpha)y_k - 2(y_k + \alpha - 1)\beta + \beta^2;$$

$$\beta = \delta_{a(k)} - \alpha\delta_{a(k-1)} + \frac{g(\hat{d}_k + 2\hat{d}_{k-1} - 2) - g(\hat{d}_k, \hat{d}_{k-1})}{2}$$

$$C^+ = \alpha^2 + 2\alpha y_k - 2(y_k - \alpha)\beta + \beta^2;$$

$$\beta = \alpha\delta_{a(k-1)} + \frac{g(\hat{d}_k + \hat{d}_{k-1} + 2) - g(\hat{d}_k, \hat{d}_{k-1})}{2}$$

$$C^- = \alpha^2 + 2\alpha y_k - 2(y_k - \alpha)\beta + \beta^2;$$

$$\beta = -\alpha\delta_{a(k-1)} + \frac{g(\hat{d}_k + \hat{d}_{k-1} - 2) - g(\hat{d}_k, \hat{d}_{k-1})}{2}$$

In various implementations, approximations may be applied to simplify the calculation of the variable β.

As explained above, a soft-decision FEC decoder (e.g., decoder 213 in FIG. 2) processes the detector output decisions $d_k$, the list $\mathcal{E}$ of the N most likely error events, and optionally the error generator output. Each element of the list $\mathcal{E}$ provides the starting index, ending index, the polarity of starting error, and the metric of the Nyquist error event.

Similar in spirit to a classic Chase decoder, a Nyquist-error-based soft-decision decoder generates a set of candidate decoder inputs, and each candidate is decoded by a hard-decision decoder. For each candidate, the reliability of the decoded codeword is calculated by determining the difference between the detector output decisions $\hat{d}$ and the decoded codeword decisions. Specifically, the difference is expressed in terms of one or more Nyquist error events, and an analytical expression may be used to calculate the resulting decoder metric. The output of the Nyquist-error-based soft-decision FEC decoder is the codeword with the smallest metric.

Based on the N Nyquist error events enumerated in $\mathcal{E}$, a set of hard-decision decoder input candidates can be generated by flipping the detector output decisions $\hat{d}$ (and correspondingly performing the receiver demapping on the resulting decisions) corresponding to different combinations of error events. For example, N candidate codewords may be generated, each corresponding to a single error event in $\mathcal{E}$. Similarly, the N(N−1)/2 candidate codewords may be generated, each corresponding to a unique pair of error events in $\mathcal{E}$, and so on for three or more error events per codeword. It is also possible to consider flipping individual bits (e.g., either the error at the start or the end of an error event) from any subset of error events.

Based on the decoder output for each candidate, it is necessary to determine a codeword metric. First, the difference between the detector output decisions $\hat{d}$ and the decoded codeword decisions must be expressed in terms of a set of Nyquist error events (i.e., for each event, the indices of the start, $k_s$, and end, $k_e$). The candidate codeword metric is then the sum of the metrics of its constituent Nyquist error events. Note that a Nyquist error event is only valid if the resulting output decisions result in a valid PAM-N sequence, and that any invalid error event results in rejection of the candidate codeword. Each 'valid' Nyquist error event has a metric M calculated using Equation 11 below:

$$M = \left| e_{k_s} - e_{k_e}(-1)^{k_e-k_s}\alpha + \sum_{k=k_s+1}^{k_e-1} e_k(-1)^{k-k_s}(1-\alpha) \right| - \quad \text{Equation 11}$$

$$(1 + \alpha^2 + (1-\alpha^2)(k_e - k_s - 1))$$

Excellent performance is possible even when the FEC decoder is only used to perform error detection (i.e., the error-correcting capacity of the FEC decoder is not exploited). In this case, the Chase-style decoder is further restricted to only flip non-overlapping Nyquist error events, i.e., unlike the more general case, it does not consider flipping only the first or only the last position in a Nyquist error event.

In addition to the savings inherent in only performing syndrome calculation, a further significant advantage is that the calculation of the codeword metric (when the syndrome is satisfied) is simply the sum of the metrics of the associated Nyquist error events (i.e., no calculation of error event metrics is required), and the error generator output can be discarded once the Nyquist error-event list has been computed.

FIGS. 6A-E are plots illustrating the performance of a Nyquist error estimator at different settings, for a range of α, using the first encoding scheme with a (68; 60) extended-Hamming code (for parity generation) and with precoding disabled. For the detector, a Nyquist-error-based sequence detector (with L=2 and $L_D$=0) is used to post-process the output of a decision-feedback equalizer. For the Nyquist-error-based sequence estimator, FIGS. 6A-E show the performance for different settings of L and $L_D$. More specifically, plot 601 in FIG. 6A corresponds to a PAM4 setting with α=0.5; plot 602 in FIG. 6B corresponds to a PAM4 setting with α=0.625; plot 603 in FIG. 6C corresponds to a PAM4 setting with α=0.75; plot 604 in FIG. 6D corresponds to a PAM4 setting with α=0.875; and plot 605 in FIG. 6E corresponds to a PAM4 setting with α=1. The Nyquist-error-based soft-decision FEC decoder operates in error-detection-only mode and processes an input list of N=12 Nyquist error events, considering all possibilities of 1 or 2 error events within the span of the codeword.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. A receiver comprising:
   an equalizer configured to filter a data signal received from a transmitter via a channel;
   a detector configured to generate a set of decisions based on the filtered data signal;
   a demapper configured to invert a mapping of Reed-Solomon interleaved symbols to decisions performed at the transmitter to generate recovered codeword bits including flipping selected ones of the decisions in the set of decisions to provide hard decisions corresponding to the recovered codeword bits;
   syndrome circuitry configured to calculate a syndrome value based on the recovered codeword bits including the hard decisions, the syndrome value indicative of whether the recovered codeword bits include errors and to generate an enable signal based on the syndrome value; and
   an error correction circuit comprising
      an error generator configured, based on the filtered data signal and the set of decisions, to generate error bits indicative of errors in the set of decisions,
      an error estimator configured, based on the error bits, to detect sequences of errors among the set of bit decisions having a predetermined pattern, and to generate a list of most likely error events, each of the most likely error events corresponding to a respective sequence of errors and having metric values, the metric values indicating a likelihood of the respective sequence of errors occurring, and
      a decoder configured, based on the enable signal, (i) to select one of the most likely error events that is most likely to occur and at least some of the metric values, and (ii) based on the selected one of the most likely error events, to update at least one of the set of decisions or the recovered codeword bits.

2. The receiver of claim 1, wherein:
   the equalizer is implemented as a feedforward equalizer; and
   the detector is implemented as a decision feedback equalizer or a maximum-likelihood sequence detector.

3. The receiver of claim 1, wherein the syndrome circuitry is configured to set the enable signal HIGH when the recovered codeword bits include errors, which are indicated by the syndrome value being a non-zero value.

4. The receiver of claim 1, wherein the decoder is configured to, based on the selected one of the most likely error events, perform a demapping function including the flipping of the selected ones of the decisions in the set of decisions corresponding to the selected one of the most likely error events.

5. The receiver of claim 1, wherein:
   the error estimator is configured to detect Nyquist error events in the set of decisions, each of the Nyquist error events including a pattern of sequential decisions having alternating polarities; and
   the decoder is configured to select the one of the most likely error events from the Nyquist error events.

6. The receiver of claim 1, wherein:
   the received data signal comprises forward error correction encoded data; and
   the decoder is implemented as a soft forward error correction decoder and configured to
      select a subset of the most likely error events, which are void of errors,
      assign a respective reliability value to each of the subset of the most likely error events, and
      select the one of the most likely error events, from the subset of the most likely error events, with a best one of the assigned reliability values.

7. The receiver of claim 1, further wherein:
   the error estimator is configured to implement a trellis for generating the metric values corresponding to the list of the most likely error events, generate lists of the metric values by traversing through the trellis respectively for the decisions in the set of decisions, dynamically update lengths of the lists for each timestep through the trellis; and
   the decoder is configured to determine reliability values of the most likely error events and, based on the reliability values, select the one of the most likely error events.

8. The receiver of claim 1, wherein the error generator is configured, based on the filtered data signal and the set of decisions, to generate each of the error bits to be a 0, +1 or −1, the 0 indicating that a current value of a decision is a correct value, the +1 indicating the correct value being equal to the current value plus one, and the −1 indicating the correct value being equal to the current value minus one.

9. The receiver of claim 1, wherein:
the error estimator is configured to implement a trellis that is limited to Nyquist error events; and
the trellis is absent paths directly connecting states of the trellis having a same polarity.

10. The receiver of claim 1, wherein:
the error estimator implements a trellis;
the trellis is based on Nyquist error events and is not based on possible transmitted codewords; and
the Nyquist error events include the most likely error events.

11. The receiver of claim 1, wherein each of most likely error events corresponds to a most likely path through a trellis of the error estimator for a respective decision of the set of decisions.

12. The receiver of claim 1, further comprising a selector configured, based on the enable signal, to select an output of the demapper or an output of the decoder.

13. The receiver of claim 1, wherein the decoder is configured to update the set of decisions based on the selected one of the most likely error events.

14. The receiver of claim 1, wherein:
the error estimator is configured to implement a trellis and sum metrics along paths of the trellis to generate metric sums respectively for the list of the most likely error events; and
the decoder is configured to
for each of the most likely error events, (i) flip corresponding pulse amplitude modulation symbols of the set of decisions to provide a codeword, (ii) compute a syndrome of the flipped pulse amplitude modulation symbols, and (iii) determine if the syndrome is equal to zero indicating the codeword is valid,
if one or more valid codewords are determined,
determine a smallest one of the metric sums for a corresponding one or more of the most likely error events having a valid codeword, and
output the valid codeword of the one or more of the most likely error events having the smallest one of the metric sums, and
if no valid codewords are determined, output hard decisions from the demapper.

* * * * *